(12) United States Patent
Garcia-Ortiz

(10) Patent No.: US 6,209,631 B1
(45) Date of Patent: Apr. 3, 2001

(54) THERMAL MANAGEMENT APPARATUS FOR A SEALED ENCLOSURE

(75) Inventor: Asdrubal Garcia-Ortiz, St. Louis, MO (US)

(73) Assignee: Esco Electronics Corporation

( * ) Notice: Subject to any disclaimer, the term of this patent is extended or adjusted under 35 U.S.C. 154(b) by 0 days.

(21) Appl. No.: 09/360,129

(22) Filed: Jul. 23, 1999

(51) Int. Cl.[7] ..................................................... F28D 15/80
(52) U.S. Cl. ...................... 165/287; 165/274; 165/104.33
(58) Field of Search ......................... 165/104.24, 104.26, 165/104.33, 272, 274, 287, 288

(56) References Cited

U.S. PATENT DOCUMENTS

| | | | |
|---|---|---|---|
| 3,746,081 | * | 7/1973 | Corman et al. . |
| 3,934,643 | * | 1/1976 | Laing . |
| 4,370,547 | * | 1/1983 | Ward ........................... 165/104.24 X |
| 4,673,030 | * | 6/1987 | Basiulis . |
| 5,647,430 | * | 7/1997 | Tajima ............................ 165/104.33 |
| 5,771,967 | * | 6/1998 | Hyman ................................. 165/274 |
| 5,950,712 | * | 9/1999 | Gates et al. . |
| 6,047,766 | * | 4/2000 | Van Brocklin et al. ......... 165/104.26 |

OTHER PUBLICATIONS

Heat Pipe Technology, "The Heat Pipe—How It Works", Aug., 1997.

* cited by examiner

Primary Examiner—Ira S. Lazarus
Assistant Examiner—Ljiljana V. Ciric
(74) Attorney, Agent, or Firm—Polster, Lieder, Woodruff & Lucchesi, L.C.

(57) ABSTRACT

Apparatus (30) controlling the temperature within a sealed enclosure (10) housing electronic components (E) whose operation produces heat, and whose operation should occur within a desired temperature range. A heat sink (32) extending through an enclosure endwall (14) conducts heat from within the enclosure to the atmosphere. Other heat sinks (40) mounted within the enclosure are in a thermal transfer relationship with the components for heat generated by the components to be drawn to the heat sinks away from the components. A heat pipe (50) extending between the respective heat sinks conducts the heat to the first said heat sink for heat to be expelled from inside the enclosure to the atmosphere. A heater (60, 62) within the enclosure generates heat to heat the components, and a thermostat (72, 74) senses when the temperature within the enclosure falls below a predetermined temperature to energize the heater. Heater is sized to cause a "dry out", condition in the heat pipe when the thermostat energizes the heater. As a result, the temperature in the enclosure is maintained within the desired range by appropriately removing heat, from or generating heat within, the enclosure and controlling the heat transfer path.

35 Claims, 5 Drawing Sheets

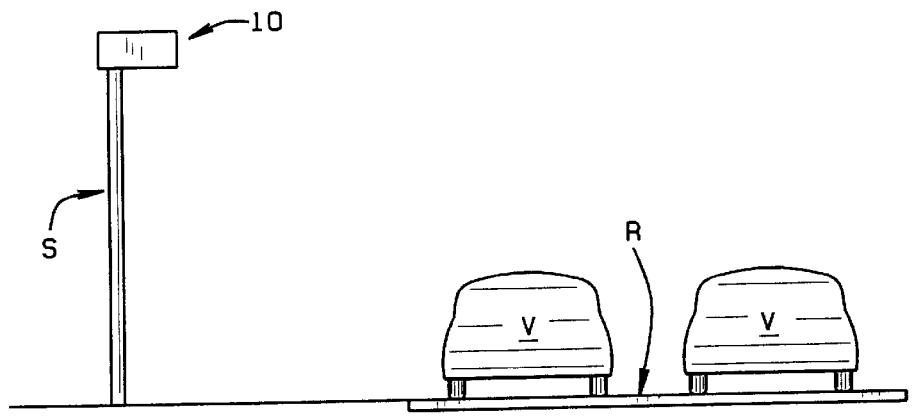
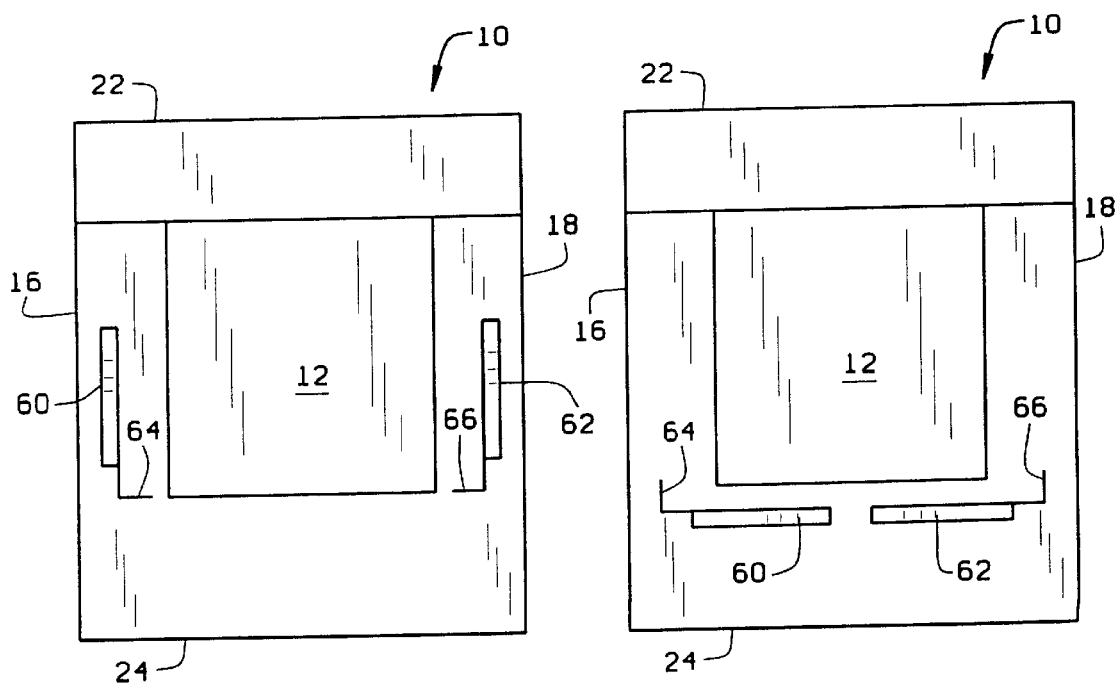

THERMAL MANAGEMENT APPARATUS FOR A SEALED ENCLOSURE

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention relates to sealed enclosures in which electronic components are housed, and more particularly, to apparatus for controlling the temperature within the enclosure to protect the components regardless of the temperature extremes to which the enclosure is subjected.

Certain electronic equipment, for example, traffic monitoring equipment, includes sensors and associated electronic processing circuitry housed in a sealed enclosure. To perform the traffic monitoring function, the enclosure is typically installed outdoors atop a pole or similar support. As a result, the enclosure and the equipment housed in it may be required to operate at temperatures ranging between −40° C. to +50° C. (−40° F. to +122° F.). At very high temperatures, ambient heat must be extracted from the enclosure; while in extremely cold conditions, heat must be supplied to the enclosure.

A traditional approach to thermal management in electrical and electronic equipment is use of heat sinks with components which cannot be allowed to get too hot. Heat sinks are used because their surface area is larger than that of the electronic components mounted on a heat sink and this helps to readily dissipate heat generated by the components. Heat transfer is often enhanced by forcing air flow over the heat sink, typically by use of a fan. The warm air drawn away from the components is then vented outside the enclosure in which the components are housed, typically through openings in the enclosure.

Another approach to thermal management involves use of liquids and thermoelectric cooling for heat extraction. Liquid cooling requires a working fluid, typically chilled water, and a pump to move the fluid from a source through a piping arrangement for heat produced by the components to be drawn to the fluid as it flows past the components. Thermoelectric cooling requires an electrical supply to operate. Again, forced air flow over the components may be used to increase heat extraction, and this requires openings in the enclosure so the heated air can be discharged to the outside environment. With heat sinks, liquid cooling, and thermoelectric cooling, the heat transfer is not 100% efficient, so a certain amount of heat remains inside the enclosure.

When electronic equipment is housed in a sealed enclosure, the above heat extraction approaches are not effective because air within the enclosure is not exchanged with the outside environment. Resulting heat build-up produces a temperature rise within the enclosure which is detrimental to the electronics. A means is therefore required to transfer heat from the equipment to the outside of the enclosure. In certain electronic applications in which components are housed in a sealed enclosure, a printed circuit board is used which has a copper inner-layer. Electronic components requiring heat extraction contact this copper layer. Edges of the board contact sides of the enclosure. While effective, this approach is very expensive. Further, this approach does not have the capability of disabling the heat extraction mechanism when the equipment is operating in a cold environment and heat needs to be retained within the enclosure to maintain the equipment within a desired band of operating temperatures.

BRIEF SUMMARY OF THE INVENTION

Among the several objects of the present invention may be noted the provision of apparatus for extracting heat from a sealed enclosure, the heat being generated by electronic components housed within the enclosure;

the provision of such apparatus in which the enclosure is an outdoors installation and the temperature of the surroundings about the enclosure can vary widely from very hot conditions to extremely cold conditions;

the provision of such apparatus to function effectively to remove heat from within the sealed enclosure to the atmosphere when the outside temperature is warm or hot and the heat generated by the components can cause their operating temperatures to be excessively high and damage the components;

the provision of such apparatus to further have the capability of generating and retaining heat within the enclosure when the outside temperature is cold and the heat generated by the components is needed to maintain their operating temperature within a normal range of operating temperatures;

the provision of such apparatus utilizing heat pipes and heat sinks to accomplish heat transfer out of the sealed enclosure;

the provision of such apparatus to further utilize strip heaters to heat the components within the sealed enclosure when the outside temperature falls below a predetermined temperature;

the provision of such apparatus in which the heat pipes have a heat transfer capacity equal to or greater than the amount of heat produced by the equipment (including electronic components) housed within the enclosure but lower than the total amount of heat produced by both the equipment and the heaters;

the provision of such apparatus in which the heat sinks employed limit the maximum temperature reached within the enclosure at a predetermined maximum temperature outside the enclosure;

the provision of such apparatus to efficiently and effectively maintain the temperature within the sealed enclosure to a range of temperatures which allow all of the equipment to function properly and with no equipment failures occurring because of temperature conditions within the enclosure;

the provision of such apparatus which can be configured for the type of equipment housed within the enclosure, as for example, stacked modular electronic components; and, the provision of such apparatus which provides a relatively low cost solution for maintaining the temperature within the sealed enclosure to a safe operating temperature.

In accordance with the invention, generally stated, apparatus is provided for controlling the temperature within a sealed enclosure in which are housed electronic components. Operation of these components produces heat, and operation of the components preferably occurs within a desired temperature range. A heat sink extends through a sidewall of the enclosure to conduct heat from within the enclosure to the atmosphere. Additional heat sinks are mounted within the enclosure in a thermal transfer relationship with the components. Heat generated by operation of the components is transferred to these heat sinks thus drawing the heat away from the components. A heat pipe which extends between the respective heat sinks now conducts the heat to the first said heat sink for the heat to be expelled to the atmosphere. A heat generator within the enclosure generates heat to heat the components. A thermostat senses when the temperature within the enclosure falls below a predetermined temperature to energize the heat generator. As a result, the temperature in the enclosure is maintained within the desired range by appropriately removing heat from or generating heat within the enclosure and controlling the heat transfer path. Other objects and features will be in part apparent and in part pointed out hereinafter.

BRIEF DESCRIPTION OF THE SEVERAL VIEWS OF THE DRAWINGS

In the drawings, FIG. 1 is a representation of a sealed enclosure installed outdoors on a support structure;

FIG. 3 is a representation of one installation of strip heaters within the enclosure;

FIG. 4 is a similar representation of a second installation of the strip heaters;

Corresponding reference characters indicate corresponding parts throughout the drawings.

DETAILED DESCRIPTION OF THE INVENTION

Figure 2A:
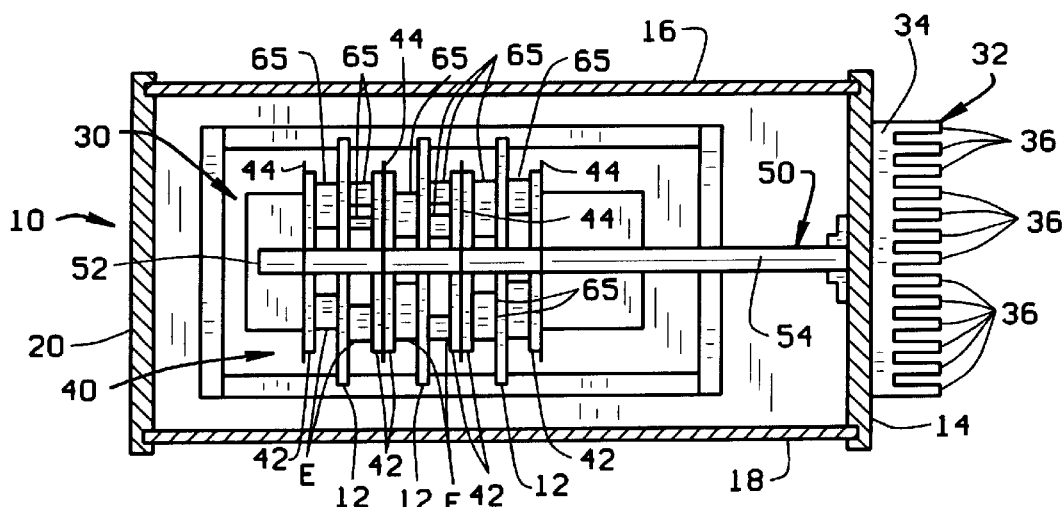
FIGS. 2A–2C are respective top, side, and rear views of the enclosure with apparatus of the present invention being shown installed in the enclosure.

Referring to the drawings, FIG. 1 shows an enclosure indicated generally 10 in which electronic components are housed. In the application shown, enclosure 10 is mounted on a support S so to be above a roadway R over which pass automotive vehicles V. An imaging system and associated processing electronics are housed within enclosure 10 for observing traffic flow over the roadway and providing traffic information to a control site at which traffic flow over different portions of a road network is monitored. Operation of the imaging system and processor is described in co-pending U.S. patent application Ser. No. 08/965,942, titled Compact Video Processing System for Remote Sensing Applications. One of the features of enclosure 10 is that it is a sealed enclosure. For this and similar applications of the system described in the co-pending application, it is important that the components not be exposed to moisture, dust, dirt, and debris, and that insects and birds not be able to gain access to the enclosure. Heretofore, while the sealed enclosure provides these advantages, there has not been an efficient way to manage the heat load and heat requirements for the equipment housed within the enclosure.

Figure 2B:
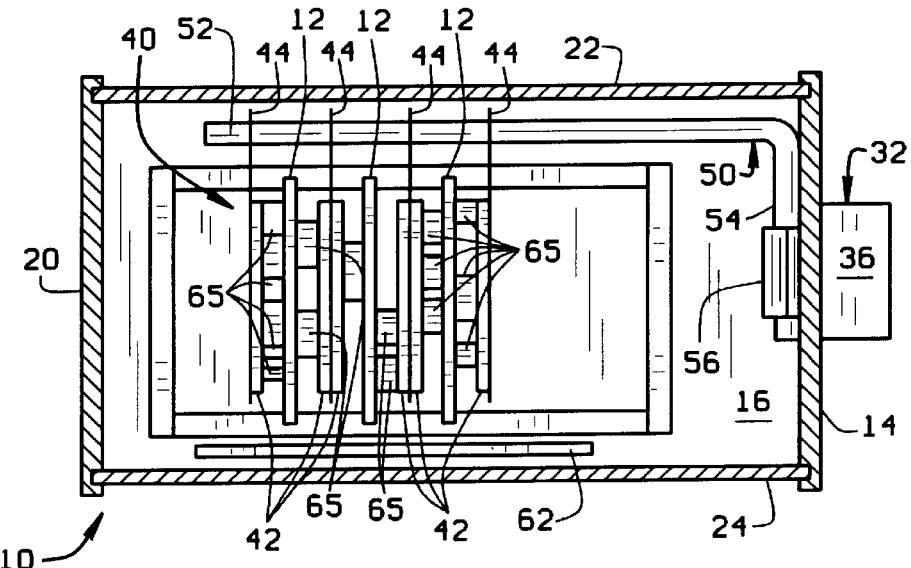
Figure 2C:
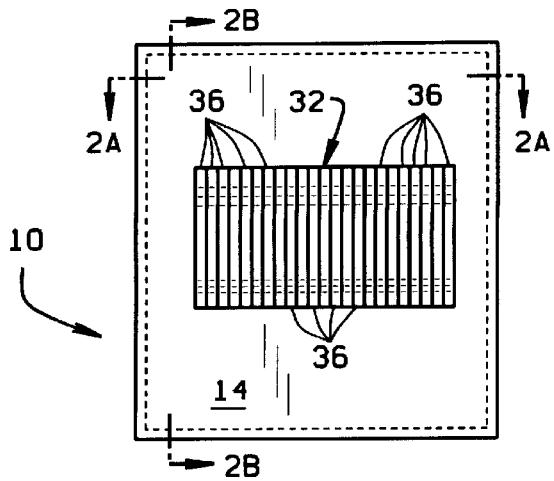

Referring to FIGS. 2A–2C, enclosure 10 is shown to include a number (three) of circuit boards 12 which are mounted in a horizontal, stacked configuration within the enclosure. Electronic components E are mounted on the various circuit boards to perform the functions required of the imaging system. As described in the above referenced co-pending application a rear wall 14 of the enclosure is removable so the stacked circuit boards can be removed from within the enclosure. However, when this rear section of the enclosure is in place, the enclosure is completely sealed; that is, there are no other openings in any of the sidewalls 16, 18, front wall 20, or top and bottom walls 22, 24 respectively forming enclosure 10.

When installed, enclosure 10 is subjected to a wide range of temperatures. A typical range to which the enclosure is subjected is −40° C. to +50° C. (−40° F. to +122° F.), not taking into account any added effects of wind and humidity. As in any electronic circuitry, operation of the electronic components generates heat, and this affects the temperature within the enclosure. Since optimal performance occurs if the electronic components operate within a desired temperature range, it is important to control the internal enclosure temperature. Apparatus 30 of the present invention accomplishes this function.

The apparatus first includes a heat sink 32 which, as shown in FIGS. 2A–2C extends through rear wall 14 of enclosure 10. Heat within the enclosure transferred to heat sink 32 is conducted through the rear wall of the enclosure to the atmosphere. The portion of the heat sink on the outside of the enclosure has a large surface area so to allow a substantial heat transfer to the atmosphere. For this purpose, the heat sink includes a base 34 which extends substantially across the rear wall of the enclosure. The height of heat sink 32 is also substantial with respect to the overall height of the enclosure. A number of fins 36, twelve of which are shown in FIGS. 2A and 2C, extend rearwardly of the enclosure from base 34.

Figure 7:
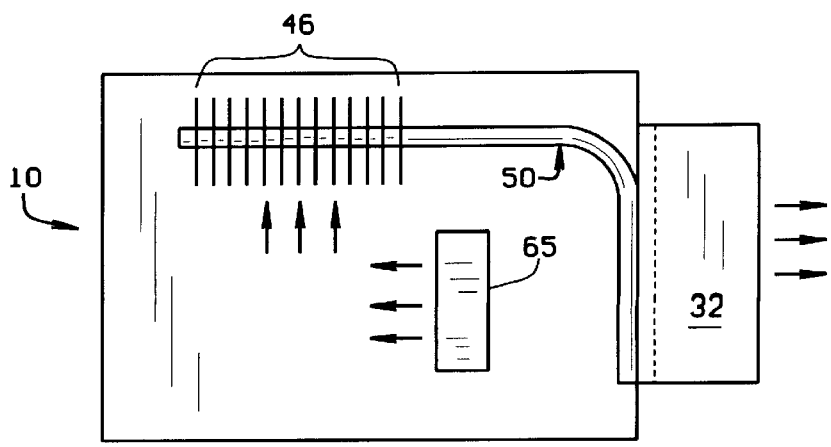
FIG. 7 illustrates one method of collection of heat generated within the enclosure by a heat pipe.
Figure 8:
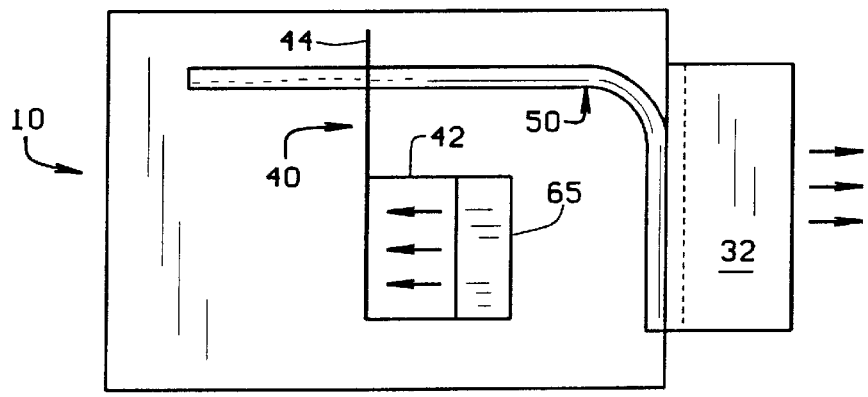
FIG. 8 illustrates a second method of heat collection.

A second heat sink 40 has a thermal interface with the electronic components E for heat generated by the electronic components to be transferred to the heat sink. This draws the heat away from the electronic components. Heat sink 40 can comprise more than one heat sink depending upon the number of circuit boards mounted within enclosure 10. For the three circuit boards 12 shown in FIGS. 2A and 2B, electronic components E are mounted on both sides of each circuit board. In FIGS. 7 and 8, it is shown that heat generated by the components is both radiated into the interior of the enclosure, as well as conducted from the components to a second heat sink through a thermal interface 42 with the heat sink. The second heat sink 40 first includes a fin 44 which physically contacts the thermal interface elements 42. As indicated by the arrows in FIG. 8, heat from a component is conducted from the component through the thermal interface to the fin 44 associated with the side of circuit board 12 on which the component is mounted. In addition, and as shown in FIG. 7, heat radiated by the component is absorbed by one of plurality of fins 46 which are mounted in the enclosure in spaced relation with respect to the components and the circuit boards.

Figure 10C:
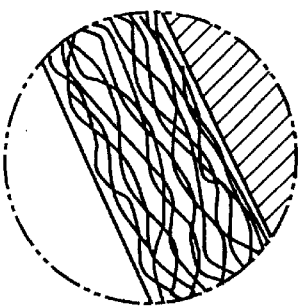
FIGS. 10A–10C respectively illustrate an evaporator, wick, and condenser portion of a heat pipe; and, FIG. 11 is an electrical schematic for thermostat controlled strip heater portion of the apparatus.
Figure 10B:
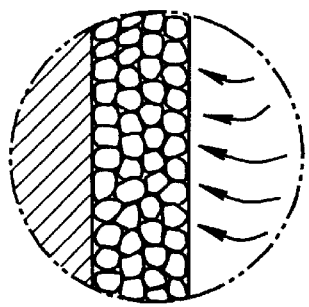
Figure 10A:
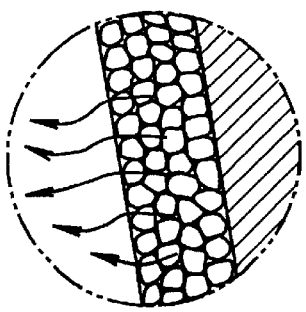

Apparatus 30 next includes a heat pipe 50 which conducts the heat absorbed by fins 44 or 46 to heat sink 32 so to remove the heat from within enclosure 10. As shown in FIGS. 10A–10C, heat pipe 50 contains a working fluid. As indicated in FIG. 10A, at an evaporator end 52 of the heat pipe, heat enters the heat pipe and vaporizes the working fluid within the pipe. The vaporized fluid now produces a pressure gradient within the pipe which forces the vaporized fluid toward a condenser end 54 of the pipe. At the condenser end of the pipe, the working fluid condenses and the heat drawn from the working fluid is transferred to heat sink 32 so it can be discharged to the atmosphere. An inner surface of the heat pipe forms a wick by which the working fluid flows back to the evaporator end of the heat pipe by a capillary action. Heat pipe 50 is an L-shaped pipe having a longitudinal reach extending generally the length of enclosure 10, the heat pipe extending immediately beneath upper wall 22 of the enclosure. At the rear end of the enclosure, the heat pipe has a vertical reach which extends down to the level of an inner end of heat sink 32, this end of the heat sink being within the enclosure. The condenser end of the heat pipe is attached to heat sink 32 by a clamp 56 so the heat pipe can thermally transfer heat to the heat sink.

While the foregoing portions of apparatus 30 are used to remove heat from the enclosure, it is sometimes desirable to generate heat within the enclosure. For this purpose, apparatus 30 includes at least one, and preferably two, heaters 60, 62. These heaters are, for example, each 50w. strip heaters whose length is at least that of the length within enclosure 10 through which the circuit boards and their connected electronic components extend. This is as shown in FIG. 2B. As shown in FIGS. 3 and 4, the strip heaters can either be mounted so to extend along opposite sides of the enclosure (FIG. 3), or along the bottom of the enclosure (FIG. 4). In either embodiment, the strip heaters are attached to respective brackets 64, 66 so to be positioned with respect to the circuit boards. If one of the heaters fails, the amount of heat produced by the other heater, when it is energized, is sufficient to raise the enclosure ambient temperature to the range in which the electronic components are designed to properly function.

Figure 11:
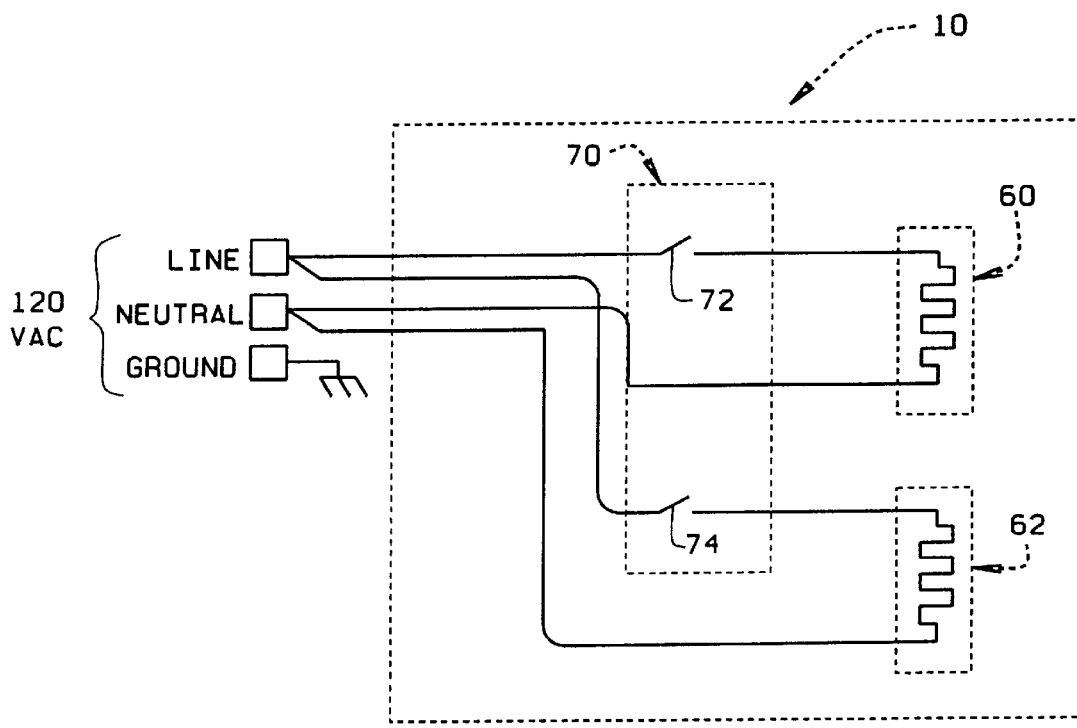
Figure 9:
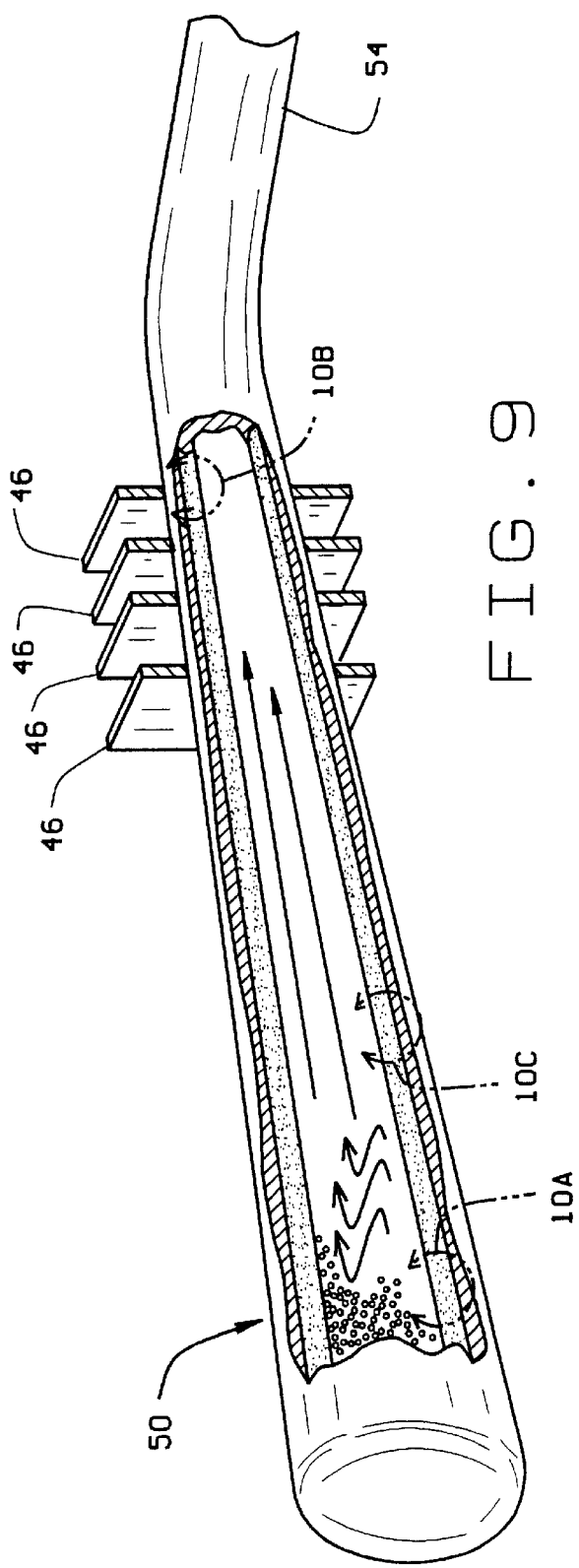
FIG. 9 is a simplified representation of a heat pipe used with the apparatus of the present invention.

A control circuit for the strip heaters is shown in FIG. 11 to include a power source external to the enclosure. Power from this source is routed to the strip heaters through a connector (not shown) in rear wall 14 of the enclosure. Each heater 60, 62, is on a separate circuit. A sensor 70 including respective thermostats 72, 74 controls application of power to the heaters. Each thermostat is normally open, but will close when the temperature within the sealed enclosure falls below a predetermined temperature. This temperature is, for example, +4° C. (+39° F.). By energizing one or both the heaters at the appropriate time, the temperature in enclosure 10 is maintained within the desired range at which the electronic components properly function.

Figure 6:
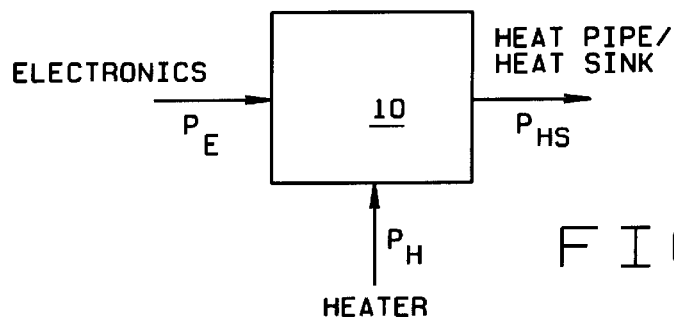
FIG. 6 is a simplified representation of thermal sources and thermal sinks within the sealed enclosure.

Referring now to FIG. 6, operation of the apparatus of the present invention can be understood with respect to the diagram which illustrates the heat sources and heat sinks within sealed enclosure 10. The electronic components E and the heaters 60, 62 supply heat to the enclosure, while heat pipe 50 and heat sinks 32 and 40 transfer heat to the atmosphere. When the unit is operating at a nominal ambient temperature Ta which is, for example +20° C. (+68° F.), the strip heaters are deactivated and the only heat source is the electronic components. These generate, for example, 30w. of heat ($P_E$ in FIG. 6). This heat is removed from within the enclosure by the heat sinks and heat pipe ($P_{HS}$ in the Fig.). This operating condition exists for an ambient temperature range of −1C to +50C (+30° F. to +122° F.). The lower limit is based upon a thermostat transition from heaters "off" to "on", at +4° C. (+39° F.), and a temperature differential ΔT of 5° C. (9° F.) between the inside and outside of enclosure 10. When the temperature falls below −1° C., the heaters are activated and supply an additional 100w. of heat within the sealed enclosure ($P_H$ in FIG. 6). This makes the total heat input into the enclosure 130w. The capacity of heat pipe 50 is 30w. Since the heat load is now 100w. more than the pipe's capacity, the heat pipe stops working. This is beneficial because if the heat pipe kept working, it would nullify the effects of having the heaters turned "on". Again, failure of one of the heaters would not effect the overall functioning of apparatus 30 to maintain the appropriate ambient temperature within enclosure 10, since even with 80w. of heat within the enclosure, this is still adequate to dry out the heat pipe.

The heaters are kept "on" for an ambient temperature range of −40° C. to +3° C. (−40° F. to +37° F.). The upper limit is based upon the thermostats turning the heaters 60, 62 "off" at +13° C. (+55° F.), and a temperature differential ΔT of 10° C. (18° F.) between the inside and exterior of enclosure 10 when heat pipe 50 is not operational.

Figure 5:
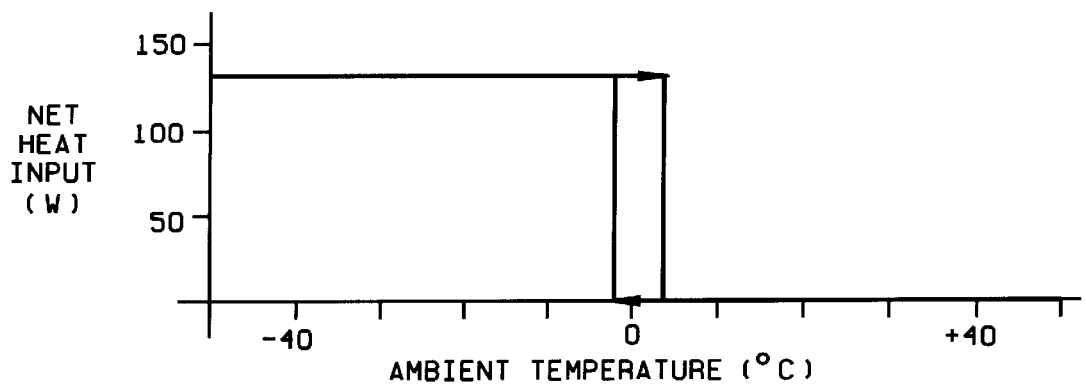
FIG. 5 is a graph illustrating the total heat within the enclosure as a function of ambient temperature.

Finally, FIG. 5 represents an ideal curve of the net heat input to enclosure 10 as a function of temperature. It will be appreciated that the actual transitions depend upon location of the thermostats within the enclosure. As shown in the Fig., at the lower end of the ambient temperature range, there is a net heat input of 130 w. within the enclosure. At the upper end of the range, all of the heat is removed from the enclosure so the net heat input is 0 w.

What has been described is apparatus providing a low cost solution for maintaining the temperature within the sealed enclosure at a safe operating temperature. The apparatus controls the heat requirements within a sealed enclosure including both heat extraction and heating depending the temperature within the enclosure. The apparatus employs heat pipes and heat sinks to transfer heat out of the enclosure, and strip heaters for heating components within the enclosure, as appropriate. Transfer capacity of the heat pipes is greater than the amount of heat produced by components housed within the enclosure, and the heat sinks limit the maximum temperature reached within the enclosure. When the strip heaters are operational, the heat they produce, when combined with that of the electronic components is sufficient to dry out the heat pipe so it does not remove heat from the enclosure which could cause the ambient enclosure temperature to fall. The apparatus efficiently and effectively maintains the temperature within the enclosure to a range of temperatures within which the components function properly and no failures occur due the temperature within the enclosure. The apparatus is configured for the type of equipment housed within the enclosure.

In view of the foregoing, it will be seen that the several objects of the invention are achieved and other advantageous results are obtained.

As various changes could be made in the above constructions without departing from the scope of the invention, it is intended that all matter contained in the above description or shown in the accompanying drawings shall be interpreted as illustrative and not in a limiting sense.

What is claimed is:

1. Apparatus controlling the temperature within a sealed enclosure in which are housed electronic components whose operation produces heat and whose operation should occur within a desired temperature range comprising:

a first heat sink extending through a sidewall of the enclosure to conduct heat from within the enclosure to outside thereof;

a second heat sink having a thermal interface with the components for heat generated by operation of the components to be transferred to said second heat sink thereby drawing heat away from said components;

a heat conductor comprising a heat pipe conducting heat from said second heat sink to said first heat sink for the heat to be removed from within the enclosure;

a heat generator comprising a heater within the enclosure generating heat to heat the components; and, a sensor responsive to the temperature within the enclosure falling below a predetermined temperature to energize the heat generator, the heat produced by said heater, when combined with the heat produced by said electronic components being sufficiently greater than the heat carrying capacity of said heat pipe so to dry out said heat pipe and prevent said heat pipe from removing heat from within said sealed enclosure whereby the temperature in the enclosure is maintained within the desired range by appropriately removing heat from or generating heat within the enclosure.

2. The apparatus of claim 1 wherein said components are electronic components mounted on circuit boards and said means in a thermal transfer relationship with the components comprises a separate, second heat sink for each circuit board.

3. The apparatus of claim 2 wherein said circuit boards are in a stacked, modular configuration and a second heat sink is installed with each module for drawing off heat from the electronic components mounted on the circuit boards in that module.

4. The apparatus of claim 1 wherein said heat conductor comprises a heat pipe having a working fluid therein which absorbs heat at one end of the pipe, conducts the heat through the pipe, and releases the heat at an opposite end of the pipe.

5. The apparatus of claim 4 wherein said components are electronic components and heat generated by said electronic components is convected within the enclosure and said heat pipe includes heat absorbing means absorbing the convected heat.

6. The apparatus of claim 5 wherein said heat absorbing means includes at least one fin attached to said heat pipe for absorbing the convected heat.

7. The apparatus of claim 6 further including a plurality of fins spaced along a length of said heat pipe within the enclosure for absorbing the convected heat.

8. The apparatus of claim 7 wherein said heat generator includes an electric heater and said sensor includes a thermostat, operation of said heater being controlled by said thermostat.

9. The apparatus of claim 8 further including a second heater whose operation is also controlled by said thermostat.

10. The apparatus of claim 9 wherein said heaters are mounted in said enclosure beneath said stack of circuit boards.

11. The apparatus of claim 8 wherein said heaters are mounted on opposite sides of said enclosure with each heater being mounted adjacent one side of said stack of circuit boards.

12. In a sealed enclosure housing electronic components mounted on circuit boards arranged in a stacked configuration, operation of said components generating heat within the sealed enclosure and operation of said electronic components being within a desired temperature range, the improvement comprising apparatus for controlling the temperature within the sealed enclosure and including:

a first heat sink extending through a sidewall of the enclosure to conduct heat from within the enclosure to the outside thereof;

at least one second heat sink having a thermal interface with said electronic components for heat generated by said electronic components to be transferred to said at least one second heat sink thereby drawing heat away from said electronic components;

a heat pipe conducting heat from said at least one second heat sink to said first heat sink to remove heat from within the enclosure, said heat pipe containing a working fluid which absorbs heat at one end of the pipe, conducts the heat through the pipe, and releases the heat at an opposite end of the pipe to said first heat sink;

at least one heater within said sealed enclosure for generating heat to heat said electronic components; and, a thermostat responsive to the temperature within said sealed enclosure falling below a predetermined temperature to energize said heater, the heat produced by said heater, when combined with the heat produced by said electronic components being sufficiently greater than the heat carrying capacity of said heat pipe so to dry out said heat pipe and prevent said heat pipe from removing heat from within said sealed enclosure whereby the temperature in said sealed enclosure is maintained within said desired range by appropriately removing heat from said sealed enclosure when an ambient temperature within said sealed enclosure is at an upper end of said range of temperatures or generating heat within said sealed enclosure when the ambient temperature is at a lower end of said range.

13. The apparatus of claim 12 wherein said second heat sink is attached to said heat pipe for heat transferred to said second heat sink to be conducted by said second heat sink to said heat pipe.

14. The apparatus of claim 13 wherein heat generated by said electronic components is convected within the enclosure and said heat pipe includes a plurality of fins spaced along a length of said heat pipe within the enclosure for absorbing the convected heat.

15. The apparatus of claim 14 further including a second heater whose operation is also controlled by said thermostat.

16. The apparatus of claim 15 wherein said heaters are mounted in said enclosure beneath said stack of circuit boards.

17. The apparatus of claim 14 wherein said heaters are mounted on opposite sides of said enclosure with each heater being mounted adjacent a side of said stack of circuit boards.

18. Apparatus controlling the temperature within a sealed enclosure in which are housed electrical and electronic components whose operation produces heat and whose operation should occur within a desired temperature range comprising:

a first heat sink extending through a sidewall of the enclosure to conduct heat from within the enclosure to outside thereof;

at least one secondary heat sink, said components being mounted on at least one circuit board in direct thermal contact with said secondary heat sink;

a heat conductor attached to said first heat sink conducting heat from said components to said heat sink for the heat to be removed from within the enclosure;

a heat generator within the enclosure generating heat to heat said components; and an actuator responsive to the temperature within the enclosure falling below a predetermined temperature to energize the heat generator, the heat produced by said heat generator, when combined with the heat produced by said components being sufficiently greater than the heat carrying capacity of said heat conductor so as to prevent said heat conductor from transferring heat to side heat sink whereby the temperature in said sealed enclosure is maintained within the desired range by appropriately removing heat from or generating heat within said sealed enclosure.

19. The apparatus of claim 18 further including a plurality of heat generators to enhance operational reliability.

20. The apparatus of claim 19 further including a plurality of actuators to enhance operational reliability.

21. The apparatus of claim 20 wherein said heat generators are electric heaters.

22. The apparatus of claim 21 wherein said electric heaters are strip heaters.

23. The apparatus of claim 22 wherein said actuators are thermostats.

24. The apparatus of claim 23 wherein said thermostats have a fixed setpoint.

25. The apparatus of claim 24 wherein said thermostats have a variable setpoint.

26. The apparatus of claim 18 wherein said heat conductor is a heat pipe.

27. The apparatus of claim 26 further including a fin attached to said heat pipe to improve the collection by said heat pipe of heat convected by said components.

28. The apparatus of claim 27 further including a plurality of fins spaced along a length of said heat pipe to further increase the amount of said heat collected by said heat pipe.

29. The apparatus of claim 28 further including a plurality of heat pipes attached to said fins to increase heat transfer from said fins to said heat sink.

30. The apparatus of claim 26 wherein secondary heat sink is attached to said heat pipe in direct thermal contact with one of said components so as to remove through thermal conduction the heat generated by said component.

31. The apparatus of claim 30 further including a plurality of electrical and electronic components in direct thermal contact with said secondary heat sink.

32. The apparatus of claim 31 further including a plurality of circuit boards in direct thermal contact with said secondary heat sink.

33. The apparatus of claim 32 further including a plurality of secondary heat sinks spaced along a length of said heat pipe in direct thermal contact with components on said circuit boards.

34. The apparatus of claim 33 wherein said circuit boards are arranged in a stacked, modular configuration and interdigitated with said secondary heat sinks.

35. The apparatus of claim 34 further including a plurality of heat pipes attached to said secondary heat sinks to increase heat transfer from said secondary heat sinks to said primary heat sink.

* * * * *